United States Patent
Haeberlen et al.

(10) Patent No.: US 9,509,284 B2
(45) Date of Patent: Nov. 29, 2016

(54) ELECTRONIC CIRCUIT AND METHOD FOR OPERATING A TRANSISTOR ARRANGEMENT

(71) Applicant: Infineon Technologies Austria AG, Villach (AT)

(72) Inventors: Oliver Haeberlen, Villach (AT); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 336 days.

(21) Appl. No.: 14/196,250

(22) Filed: Mar. 4, 2014

(65) Prior Publication Data

US 2015/0256155 A1 Sep. 10, 2015

(51) Int. Cl.
*H03K 17/16* (2006.01)
*H03K 17/56* (2006.01)
(Continued)

(52) U.S. Cl.
CPC ............ *H03K 3/012* (2013.01); *H01L 27/0605* (2013.01); *H01L 27/085* (2013.01); *H01L 29/7786* (2013.01); *H03K 17/063* (2013.01); *H03K 17/122* (2013.01); *H03K 17/145* (2013.01); *H03K 17/16* (2013.01); *H03K 17/56* (2013.01); *H03K 17/567* (2013.01); *H01L 29/2003* (2013.01); *H01L 29/402* (2013.01); *H03K 2017/6875* (2013.01); *H03K 2217/0036* (2013.01)

(58) Field of Classification Search
CPC . H01L 27/00; H01L 27/0605; H01L 27/085; H01L 29/00; H01L 29/2003; H01L 29/402; H01L 29/7786; H03K 17/00; H03K 17/063; H03K 17/122; H03K 17/145; H03K 17/16; H03K 17/56; H03K 17/567; H03K 2017/00; H03K 2017/6875; H03K 2217/00; H03K 2217/0036; H03K 3/00; H03K 3/012
USPC .......................................................... 327/427
See application file for complete search history.

(56) References Cited

U.S. PATENT DOCUMENTS

2007/0045670 A1* 3/2007 Kuraguchi .......... H01L 29/7787
257/249
2011/0210377 A1 9/2011 Haeberlen et al.
(Continued)

OTHER PUBLICATIONS

Hirler, et al., "Circuit with a Plurality of Bipolar Transistors and Method for Controlling Such a Circuit", U.S. Appl. No. 13/893,450, filed May 14, 2013.
(Continued)

*Primary Examiner* — Lincoln Donovan
*Assistant Examiner* — David Mattison
(74) *Attorney, Agent, or Firm* — Murphy, Bilak & Homiller, PLLC

(57) ABSTRACT

An electronic circuit includes a transistor arrangement with a plurality of transistor devices, each including a control node and a load path between a first load node and a second load node, and having the load paths connected in parallel. The electronic circuit further includes a drive circuit coupled to the control node of each of the plurality of transistor devices, and configured to receive an input signal. Each of the plurality of transistor devices includes a two-dimensional electron gas (2DEG) in the load path, and a field plate adjacent the 2DEG. The drive circuit is configured to receive a load signal that represents at least one load parameter of the transistor arrangement and is configured to one of activate and deactivate at least one of the plurality of transistor devices based on the load signal.

24 Claims, 7 Drawing Sheets

(51) Int. Cl.
  *H03K 17/567* (2006.01)
  *H01L 27/085* (2006.01)
  *H03K 3/012* (2006.01)
  *H03K 17/06* (2006.01)
  *H03K 17/12* (2006.01)
  *H03K 17/14* (2006.01)
  *H01L 29/778* (2006.01)
  *H01L 27/06* (2006.01)
  *H03K 17/687* (2006.01)
  *H01L 29/40* (2006.01)
  *H01L 29/20* (2006.01)

(56) References Cited

U.S. PATENT DOCUMENTS

| | | |
|---|---|---|
| 2012/0049898 A1 | 3/2012 | Mauder et al. |
| 2012/0153967 A1 | 6/2012 | Koop |
| 2012/0280278 A1 | 11/2012 | Curatola et al. |
| 2012/0305993 A1 | 12/2012 | Willmeroth et al. |
| 2012/0306003 A1 | 12/2012 | Willmeroth et al. |
| 2012/0306464 A1 | 12/2012 | Hirler et al. |
| 2013/0062693 A1* | 3/2013 | Tanaka ............... H01L 29/404 257/339 |
| 2014/0035628 A1* | 2/2014 | Oaklander ........... H03K 17/063 327/109 |

OTHER PUBLICATIONS

Hirler, et al., "Circuit with a Plurality of Diodes and Method for Controlling Such a Circuit", U.S. Appl. No. 13/893,430, filed May 14, 2013.

Rieger, et al., "Adjustable Transistor Device", U.S. Appl. No. 13/837,292, filed Mar. 15, 2013.

* cited by examiner

ELECTRONIC CIRCUIT AND METHOD FOR OPERATING A TRANSISTOR ARRANGEMENT

TECHNICAL FIELD

This disclosure in general relates to an electronic circuit including at least two transistor devices, such as HEMTs (High Electron Mobility Transistors), and to a method for operating such circuit.

BACKGROUND

Transistors are widely used as electronic switches in a variety of different electronic and electric applications such as industrial applications, automotive applications, or consumer electronics applications. A transistor can be switched on and off by applying a suitable drive signal to a control terminal (gate terminal) of the transistor. In an on-state, the transistor is conducting and allows a current to flow through a load path (drain-source path). In an off-state, the transistor is blocking and prevents a current to flow through the load path.

Losses occur when a transistor is operated as switch. These losses include conduction losses, and switching losses. "Conduction losses" are those losses that occur in the transistor when a current flows through the load path. These losses are equivalent to the energy (power) dissipated in the transistor when the transistor is in the on-state. These conduction losses are substantially dependent on an on-resistance ($R_{ON}$) of the transistor, which is the electrical resistance of the load path in the on-state. "Switching losses" are those losses involved in switching on and off the transistor. That is, the switching losses are substantially defined by the energy required to change the switching state of the transistor.

SUMMARY

One embodiment relates to an electronic circuit. The electronic circuit includes a transistor arrangement with a first type transistor device and at least one second type transistor device, each including a control node and a load path between a first load node and a second load node, and having the load paths connected in parallel. The electronic circuit further includes a drive circuit coupled to the control node of the first type transistor device and the control node of the second type transistor device, and configured to receive an input signal. Each of the first type transistor device and the second type transistor device comprises a two-dimensional electron gas (2DEG) in the load path, and a field plate adjacent the 2DEG, wherein the field plate of the first type transistor device is connected to one of the control node and the second load node of the first type transistor device. The drive circuit is configured to receive a load signal that represents at least one load parameter of the transistor arrangement and is configured to one of activate and deactivate the at least one second type transistor device based on the load signal.

One embodiment relates to a method. The method includes obtaining a load signal that represents at least one load parameter of a transistor arrangement that comprises a first type transistor device and at least one second type transistor device; receiving an input signal by a drive circuit; and one of activating and deactivating by the drive circuit the at least one second type transistor device based on the load signal. Each of the first type transistor device and the at least one second type transistor device includes a control node, a load path between a first load node and a second load node, a two-dimensional electron gas (2DEG) in the load path, and a field plate adjacent the 2DEG. The load paths of the first type transistor device and the at least one second type transistor device are connected in parallel, and the field plate of the first type transistor device is connected to one of the control node and the second load node of the first type transistor device.

Another embodiment relates to an electronic circuit. The electronic circuit includes a transistor arrangement with a plurality of transistor devices, each including a control node and a load path between a first load node and a second load node, and having the load paths connected in parallel; and a drive circuit coupled to the control node of each of the plurality of transistor devices, and configured to receive an input signal. Each of the plurality of transistor devices comprises a two-dimensional electron gas (2DEG) in the load path, and a field plate adjacent the 2DEG. The drive circuit is configured to receive a load signal that represents at least one load parameter of the transistor arrangement and is configured to one of activate and deactivate at least one of the plurality of transistor devices based on the load signal.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
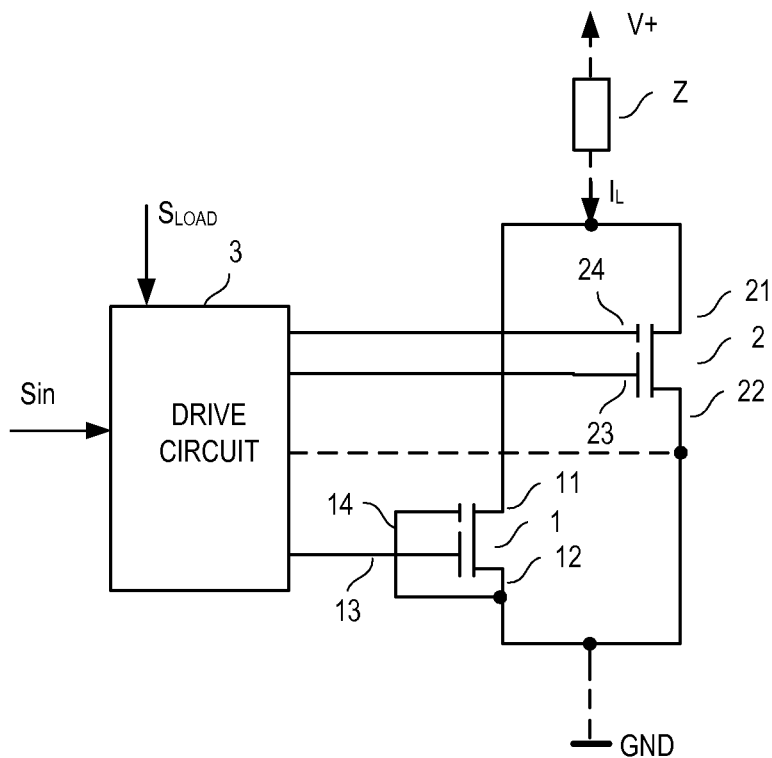
FIG. 1 shows one embodiment of an electronic circuit that includes a transistor arrangement with a first type transistor device and a second type transistor device, and a drive circuit.

FIG. 1 shows one embodiment of an electronic circuit that includes a transistor arrangement with a first type transistor device 1 and a second type transistor device 2, and a drive circuit 3 configured to drive the transistor arrangement. In FIG. 1, the first type transistor device 1 and the second type transistor device 2 are represented by circuit symbols. Embodiments of the first type transistor device 1 and the second type transistor device 2 are explained with reference to FIGS. 2 and 3 in greater detail herein below.

Referring to FIG. 1, each of the first type transistor device 1 and the second type transistor device 2 includes a control node 13, 23, and a load path between a first load node 11, 21 and a second load node 12, 22. The load paths of the first type transistor device 1 and the second type transistor device 2 are connected in parallel. That is, the first type transistor device 1 and the second type transistor device 2 have their first load nodes 11, 21 electrically connected, and the first type transistor device 1 and the second type transistor device 2 have their second load nodes 12, 22 electrically connected.

Each of the first type transistor device 1 and the second transistor device 2 further includes a field plate (field electrode) that is represented by circuit nodes 14, 24 in the equivalent circuit diagram shown in FIG. 1. The field plate 14 of the first type transistor device 1 is electrically coupled to one of the control node 13 and the second load node 12 of the first type transistor device 1. In the embodiment shown in FIG. 1, the field plate 14 of the first type transistor device 1 is connected to the second load node 12. Alternatively (and not shown in FIG. 1), the field plate 14 is connected to the control node 13 of the first type transistor device 1. The field plate 24 of the second type transistor device 2 is not permanently coupled to one of the gate node 23 and the second load node 22 of the second type transistor device 2, but is coupled to the drive circuit 3.

The first type transistor device 1 and the second type transistor device 2 each have their control node 13, 23 coupled to the drive circuit 3 in order to be driven by the drive circuit 3. The drive circuit 3 is configured to drive the transistor arrangement with the first type transistor device 1 and the second type transistor device 2 dependent on an input signal Sin of the drive circuit 3. The input signal Sin defines a desired operation node (operation state) of the transistor arrangement. Based on the input signal Sin, the drive circuit 3 is configured to operate the transistor arrangement in one of an on-mode (on-state) and an off-mode (off-state). In the on-mode, at least the first type transistor device 1 is conducting (is switched on). In the off-mode both of the first type transistor device 1 and the second type transistor device 2 are blocking (are switched off). The first type transistor device 1 and the second type transistor device 2 can each be switched on or off by applying a suitable drive signal to the respective control node 13, 23. This is explained in greater detail herein below.

The electronic circuit can be used as an electronic switch for switching (controlling) a load current $I_L$ through a load Z. For this, the transistor arrangement may be connected in series with the load Z, with the series circuit including the transistor arrangement and the load Z being coupled between first and second supply nodes for receiving first and second (positive and negative) supply potentials V+, GND. According to one embodiment, the first supply potential V+ is a positive supply potential, and the second supply potential is a negative supply potential or a reference potential, such as ground. More specifically, the load paths of the first type transistor device 1 and the at least one second type transistor device 2 are connected in series with the load Z. The load Z may include any type of electric or electronic load. The load Z may even include one or more further transistors that together with the transistor arrangement may form a half-bridge. In the embodiment shown in FIG. 1, the transistor arrangement is connected as a low-side switch between the load Z and the negative supply potential/reference potential GND. However, this is only an example. The transistor arrangement could also be connected as a high-side switch between the load Z and the positive supply potential V+.

Referring to FIG. 1, the drive circuit 3 is further configured to receive a load signal $S_{LOAD}$. The load signal $S_{LOAD}$ represents a load state of the transistor arrangement. The drive circuit 3 is configured to one of activate and deactivate the at least one second type transistor device 2 based on the load signal $S_{LOAD}$. An operation mode in which the second type transistor device 2 is activated will be referred to as activated mode in following, and an operation mode in which the second type transistor device 2 is deactivated will be referred to as deactivated mode in the following. In the activated mode, the drive circuit 3 may switch on and off the second type transistor device 2 synchronously with the first type transistor device 1. In the deactivated mode, the drive circuit 3 keeps the second type transistor device 2 switched off independent of the operation mode of the first type transistor device 1.

Figure 2:
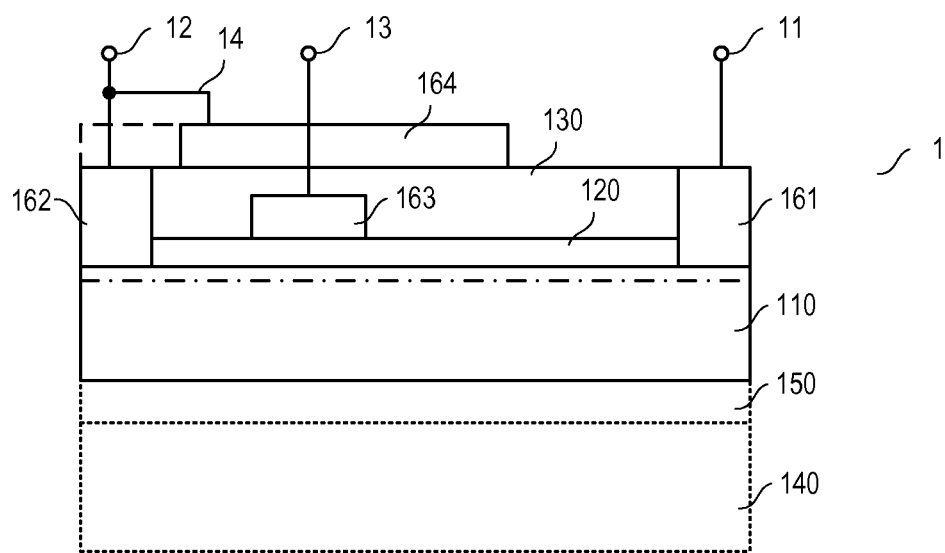
FIG. 2 illustrates a vertical cross sectional view of a first type transistor device according to one embodiment.
Figure 3:
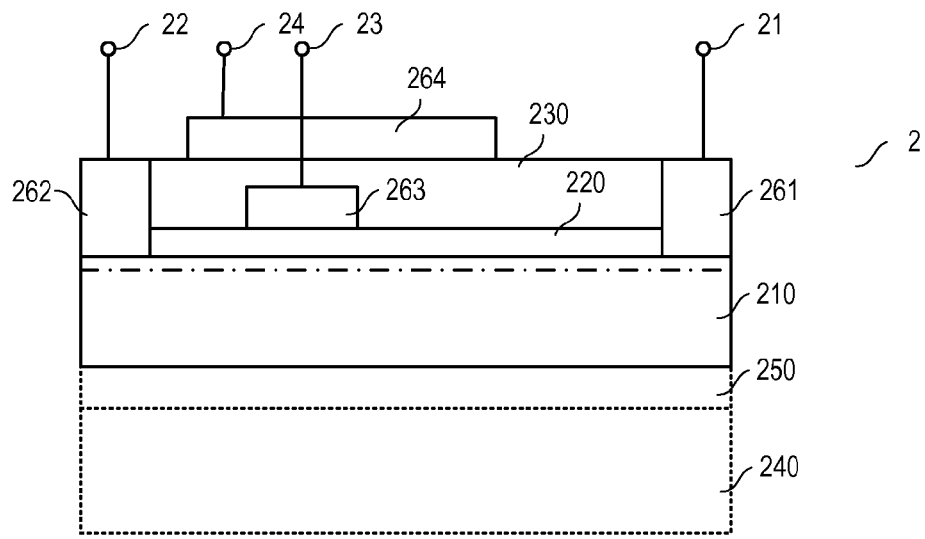
FIG. 3 illustrates a vertical cross sectional view of a second type transistor device according to one embodiment.

The load path of each of the first type transistor device 1 and the second type transistor device 2 includes a two-dimensional electron gas (2DEG). This is explained with reference to FIGS. 2 and 3 below. FIG. 2 shows a vertical cross sectional view of the first type transistor device 1 according to one embodiment, and FIG. 3 shows a vertical cross sectional view of the second type transistor device 2 according to one embodiment. The first type transistor device 1 and the second type transistor device 2 are implemented as HEMTs (High Electron Mobility Transistors) in these embodiments.

Referring to FIG. 2, the first type transistor device 1 includes a first semiconductor layer 110, and a second semiconductor layer 120 on the first semiconductor layer 110. The first semiconductor layer 110 is briefly referred to as first layer 110 in the following, and the second semiconductor layer 120 is briefly referred to as second layer 120 in the following. Each of the first layer 110 and the second layer 120 include a compound semiconductor material, wherein the materials of the first layer 110 and the materials of the second layer 120 are selected such that there is a two-dimensional electron gas (2DEG) in the first along an interface between the first layer 110 and the second layer 120. In the embodiment shown in FIG. 2, the 2DEG is formed in the first layer 110 along the interface. The 2DEG formed in the first layer 110 is schematically illustrated using a dashed-and-dotted line in FIG. 2. The first layer 110 will also be referred to as channel layer following, and the second layer 120 will also be referred to as barrier layer in the following. According to one embodiment, the channel layer 110 includes GaN (gallium nitride), and the barrier layer 120 includes AlGaN (aluminum gallium nitride). GaN and AlGaN are III-V semiconductor materials. Implementing the channel layer 110 to include GaN and implementing the barrier layer 120 to include AlGaN is only an example. Other combination III-V semiconductor materials may be used as well in order to form a 2DEG in the channel layer 110.

Referring to FIG. 2, the semiconductor arrangement with the channel layer 110 and the barrier layer 120 may be arranged on a substrate 140 (illustrated in dotted lines in FIG. 2). The substrate 140 includes, for example, Si (silicon) or SiC (silicon carbide). A nucleation layer (seed layer, buffer layer) 150 may be arranged between the substrate 140 and the first layer 110. This nucleation layer 150 includes AlN (aluminum nitride) according to one embodiment.

The channel layer 110 and the barrier layer 120 form the load path of the first type transistor device 1. A first electrode 161 forms the first load node 11 or is connected to the first load node 11, and a second electrode 162 forms the second load node 12 or is connected to the second load node 12 of the first type transistor device 1. The first electrode 161 and the second electrode 162 are spaced apart in a lateral direction of the semiconductor arrangement with the channel layer 110 and the barrier layer 120. In the embodiment shown in FIG. 2 each of the first electrode 161 and the second electrode 162 extends through the barrier layer 120 to the 2DEG. According to another embodiment (not shown), at least one of the first electrode 161 and the second 162 extends into the 2DEG or even through the 2DEG.

The 2DEG provides a very low-ohmic path between the first electrode 161 and the second electrode 162 when the first type transistor device 1 is in the on-state. The first type transistor device 1 can be switched off by interrupting the 2DEG between the first electrode 161 and the second electrode 162 using a gate 163. The gate 163 is located between the first electrode 161 and the second electrode 162 and is spaced apart from each of the first electrode 161 and the second electrode 162. In the present embodiment, the gate 163 is spaced apart from the 2DEG and separated from the 2DEG by the barrier layer 120. However, this is only an example. The gate 163 could also extend into the barrier layer 120. According to another embodiment, the gate 163 extends through the barrier layer 120 to the 2DEG. In the latter case, the semiconductor device can be referred to as MESFET (Metal-Semiconductor Field-Effect Transistor). Whether the first type transistor device 1 is a normally-on transistor device or normally-off transistor device can be defined by suitably selecting the gate 163. According to one embodiment, the gate 163 is implemented such that the first type transistor device 1 is a normally-off transistor device. In this case, the gate 163 includes, for example, a p-doped semiconductor material such as a p-doped III-V semiconductor material. Examples of a p-doped III-V semiconductor material include, without being restricted to, p-doped GaN or p-doped AlGaN. Such p-doped semiconductor material causes a depletion region in the barrier layer 120 and in adjoining regions of the channel layer 110 that interrupts the 2DEG when a drive voltage applied between the control node 13 (that is connected to the gate 163) and the first load node 11 is zero. In the following, the control node 13 will be referred to as gate node, the first load node 11 will be referred to as drain node, and the second load node 12 will be referred to as source node. Consequently, the drive voltage will be referred to as gate-source voltage of the transistor device.

The normally-off first type transistor device 1 switches on when a positive gate-source voltage is applied. The threshold voltage, which is the voltage at which the transistor device starts to conduct, is dependent on the specific type of gate 163 and can be in the range of several volts, such as between 1 V and 10 V, in particular between 1 V and 5 V.

According to another embodiment, the first type transistor device 1 is a normally-on transistor device. In this case, the transistor device conducts when the gate-source voltage is higher than a negative threshold voltage. The voltage level of the threshold voltage is dependent on the specific type of gate 163. A normally-on transistor device may be obtained by implementing the gate 163 with a Schottky metal. Examples of a Schottky metal include, but are not restricted to, nickel (Ni), platinum (Pt), a nickel—platinum alloy, molybdenum (Mo).

Referring to FIG. 2, the first type transistor device 1 further includes a field plate (field electrode) 164. The field plate 164 is spaced apart from the 2DEG. In the embodiment shown in FIG. 2, the field plate 162 is arranged on a passivation layer 130, with the passivation layer 130 adjoining the barrier layer 120. The gate 163 is embedded in the passivation layer 130 in the present embodiment, and the gate 163 is arranged between the field plate 162 and the 2DEG in this embodiment. Referring to the explanation above, the field plate 164 is electrically connected either to the source node 12 and the source electrode 162 (as shown), respectively, or to the gate node 13 (not shown). The electrical connection may be provided through a conventional wiring arrangement. This wiring arrangement is schematically illustrated in FIG. 2. According to another embodiment (illustrated in dashed lines in FIG. 2) the field plate 64 adjoins the source electrode 162. In a conventional way, the field plate 162 serves to prevent or at least reduce peaks of an electric field in the channel layer 110 and the barrier layer 120 when the transistor device is in the off-state.

FIG. 3 shows a vertical cross sectional view of a second type transistor device 2 according to one embodiment. The second type transistor device 2 shown in FIG. 3 is implemented similar to the first type transistor device 1 shown in FIG. 2 and includes a channel layer 210, a barrier layer 220 on the channel layer 210, a 2DEG in the channel layer 210, an optional substrate 240 and a nucleation layer 250 between the substrate 240 and the channel layer 210. A gate 263 controls (modulates) the 2DEG between a first electrode 261 and a second electrode 262. The first electrode 261 is connected to the first load node 21 or forms the first load node, and the second electrode 262 is connected to the second load node or forms the second load node 22. The gate 263 is embedded in a passivation layer 230 in this embodiment. The explanation provided concerning each of the device features, except for the field plate 164, of the first type transistor device 1 shown in FIG. 2 apply to the corresponding device features of the second type transistor device 2 shown in FIG. 3 accordingly.

The second type transistor device 2 shown in FIG. 3 is different from the first type transistor device 1 shown in FIG. 2 in that the field plate 264 of the second type transistor device 2 is neither permanently coupled to the source electrode 261 nor to the gate 263. The field plate 264 can be driven via a separate node 24 that will be referred to as field plate node 24 in the following.

According to one embodiment, the first type transistor device 1 and the second type transistor device 2 have substantially the same geometrical characteristics (that is, have substantially the same geometry). Geometrical device characteristics includes, for example, a distance between the drain electrode 161, 261 and the source electrode 162, 262 (drain-source distance), a distance between the source electrode 162, 262 and the gate electrode 163, 263 (source-gate distance), a distance between the gate electrode 164, 264 and the drain electrode (gate-drain distance) 161, 261, and an overlap of the field electrode 163 over the barrier layer 120, 220 (barrier layer overlap) in a region between the gate electrode 164, 264 and the drain electrode 161, 261. The "barrier layer overlap" is defined by how far the field electrode 164, 264 extends from the gate electrode 163, 263 in the direction of the drain electrode 161, 261.

According to another embodiment, the first type transistor device 1 and the second type transistor device 2 are different in at least one of the geometrical device characteristics explained above. Specifically, the second type transistor device may be implemented with a larger gate-drain distance than the first type transistor device. According to another embodiment, the first type transistor device 1 and the second type transistor device 2 are implemented with different barrier layer overlaps. In particular, the field electrode 264 of the second type transistor device 2 may extend further in the direction the drain electrode 261 than the field electrode 164 of the first type transistor device 1 extends in the direction the drain electrode 161, wherein the first type transistor device 1 and the second type transistor device may have substantially identical source-drain and gate-drain distances.

Figure 4A:
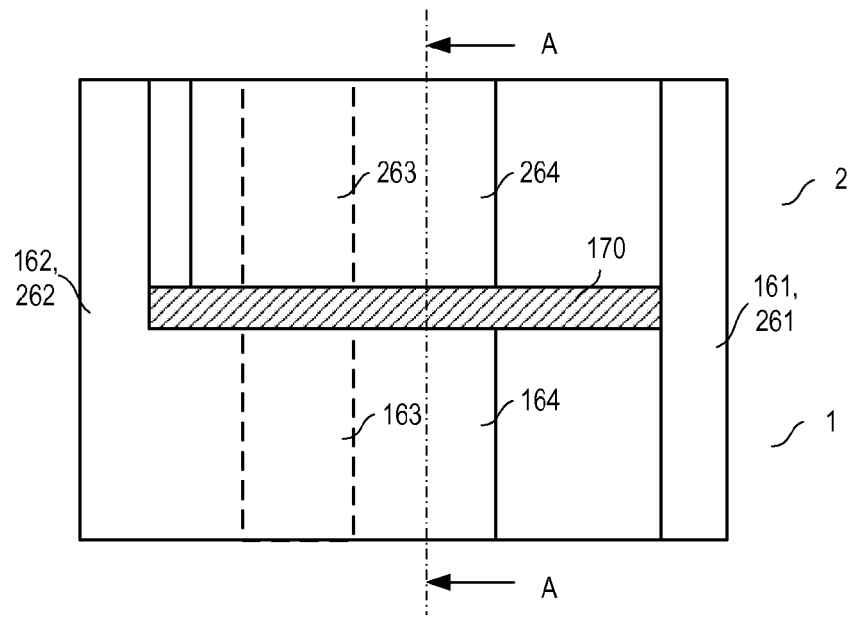
FIGS. 4A-4B show a top view and a vertical cross sectional view, respectively, of a semiconductor body in which a first type transistor device and a second type transistor device are integrated.
Figure 4B:
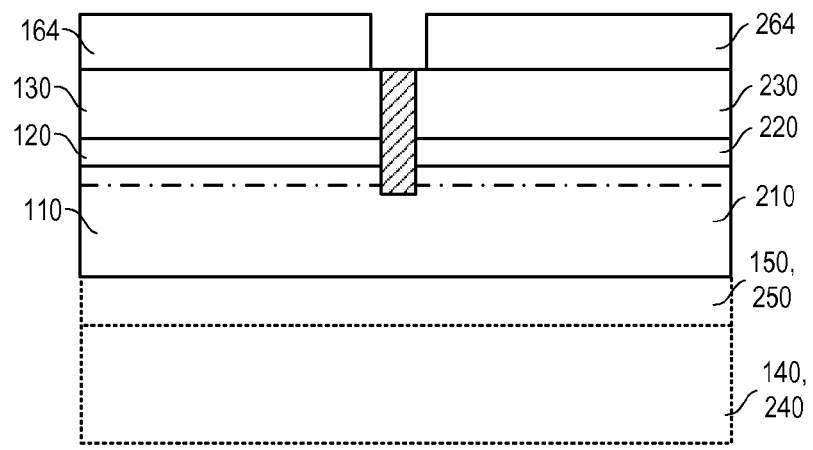

According to one embodiment, the first type transistor device 1 and the second type transistor device 2 are integrated in a common semiconductor arrangement. FIG. 4A shows a top view on such semiconductor arrangement, and FIG. 4B shows a vertical cross sectional view of the semiconductor arrangement in a section plane A-A illustrated in FIG. 4A. Referring to FIG. 4A, the first type transistor device 1 and the second type transistor device 2 share the source electrode, and share the drain electrode. That is, the drain electrode 161 of the first type transistor device 1 and the drain electrode 261 of the second type transistor device 2 are formed by the same electrode, and the source electrode 162 of the first type transistor device 1 and the source electrode 262 of the second type transistor device 2 are formed by the same electrode. Referring to FIG. 4B the first type transistor device 1 and the second type transistor device 2 have the same substrate 140, 240, the same nucleation layer 150, 250, and the same channel layer 110, 210. However, the 2DEG of the first type transistor device 1 and the 2DEG second type transistor device 2 are separated by an isolation region 170. This isolation region may include implanted damage atoms that prevent the generation of a 2DEG in those regions in which the damage atoms are implanted. The isolation region 170 could be implemented such that it separates the 2DEG in two sections, namely one section associated with the first type transistor device 1 and one section associated with the second type transistor device 2. According to another embodiment, the isolation layer 170 is also arranged in the barrier layer so that it separates the barrier layer 120 of the first type transistor device 1 from the barrier layer 220 of the second type transistor device 2. The two transistor devices may have separate passivation layers 130, 230 (as shown in FIG. 4B) or may have one common passivation layer (not shown). The damage atoms implanted to form the isolation region 170 may include at least one of, nitrogen (N), helium (He), or argon (Ar).

According to another embodiment, the isolation region 170 includes a trench that is etched through the barrier layers 120, 220 and the 2DEG into the channel layers 110, 210 and that subdivides the 2DEG in two sections, namely one section associated with the first type transistor device 1 and one section associated with the second type transistor device 2. The trench may be filled with an electrically insulating filling material such as, for example, an oxide, a nitride, a glass, or the like.

Operating a transistor device of the kind of the first type transistor device 1 explained with reference to FIG. 2 causes losses. Those losses include conduction losses and switching losses. Conduction losses are those losses that occur when a current flows between the drain electrode 161 and the source electrode 162 through the 2DEG. Those losses may be reduced by increasing the width of the 2DEG in the direction perpendicular to the section plane shown in FIG. 2 and/or by connecting several of the transistor devices shown in FIG. 2 in parallel. Switching losses are those losses that occur in connection with charging/discharging the gate 163 and the field plate 164 when the transistor device changes the switching state (operation state) from the on-state to the off-state, and vice versa. Usually (at a given switching frequency of the transistor device), the switching losses increase as the current rating of the transistor device increases and the on-resistance decreases, respectively. The current rating defines the maximum current the transistor device may conduct without facing the risk of being destroyed.

In the electronic circuit shown in FIG. 1, operation of the transistor arrangement with the first type transistor device 1 and the least on second type transistor device 2 is optimized in such a way that the overall losses that include conduction losses and switching losses are lower than in a conventional transistor device that has a current rating corresponding to the current rating of the transistor arrangement of FIG. 1. This is explained in detail herein below.

Figure 5:
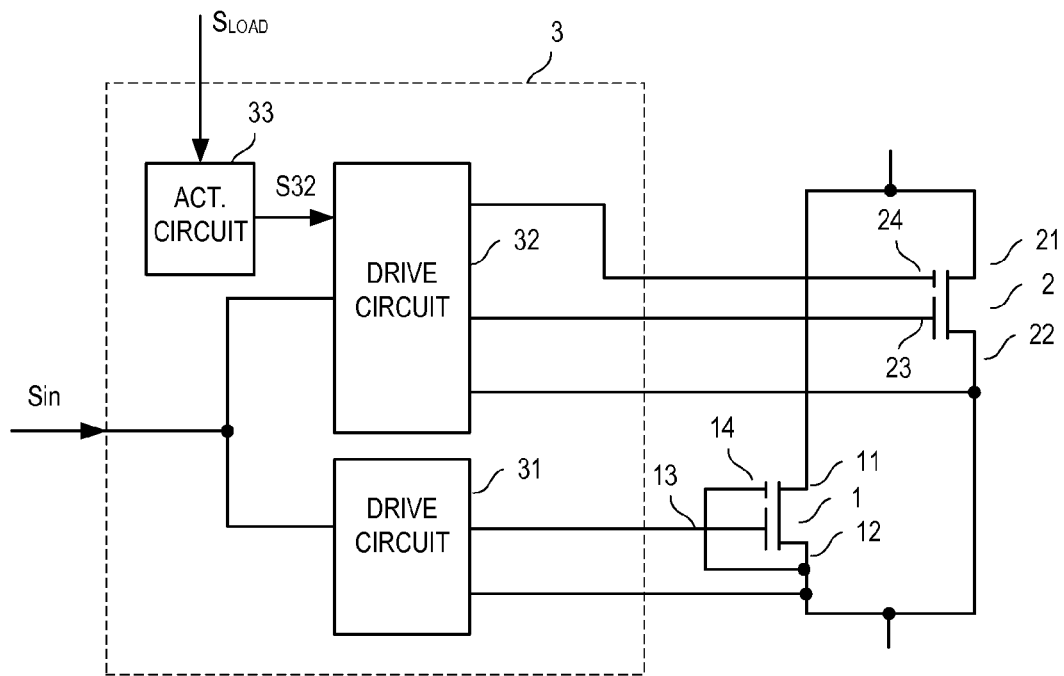
FIG. 5 illustrates one embodiment of the drive circuit.

Referring to the explanation above, the drive circuit 3 is configured to one of activate and deactivate second type transistor device 2 dependent on the load signal $S_{LOAD}$. FIG. 5 schematically illustrates one embodiment of a drive circuit 3 having this functionality.

Referring to FIG. 5, the drive circuit 3 includes a first drive unit 31 configured to drive the first type transistor device 1 dependent on the input signal Sin, and a second drive unit 32 configured to drive the second drive transistor device 2 dependent on the input signal Sin and dependent on an activation signal S32. The activation Signal S32 is provided by an activation circuit 33 that receives the load signal $S_{LOAD}$. The first drive unit 31 is configured to switch on and off the first type transistor device based on the input signal Sin. That is, the first drive unit 31 switches on the first type transistor device 1 when the input signal Sin has an on-level, and switches off the first type transistor device 1 when the input signal Sin has an off-level different from the on-level. An on-level of the input signal Sin indicates that is desired to switch on the transistor arrangement, and an off-level of the input signal Sin indicates that it is desired to switch off the transistor arrangement.

Figure 6:
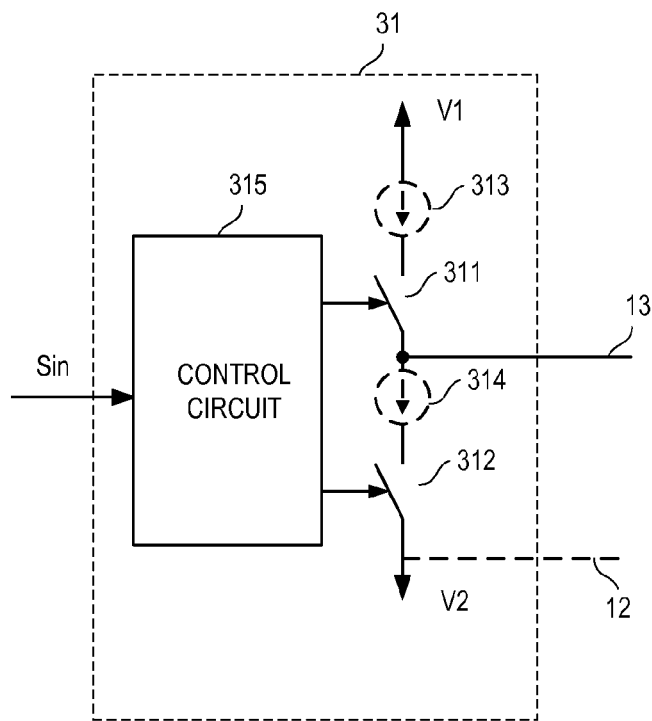
FIG. 6 illustrates one embodiment of a first drive unit in the drive circuit.

FIG. 6 illustrates one embodiment of the first type drive unit 31. This drive unit 31 includes a first switch 311 configured to connect the gate node 13 to a circuit node where a first drive potential V1 is available, and a second switch 312 configured to connect the gate node 13 to a circuit node where a second drive potential V2 is available. The first drive potential V1 is selected such that the first type transistor device 1 is in the on-state when the first drive potential V1 is applied to the gate node 13, and the second drive potential V2 is selected such that the first type transistor device 1 is in the off-state when the second drive potential V2 is applied to the gate node 13. A control circuit 315 receives the input signal Sin and switches on the first switch 311 in order to switch on the first type transistor device 1 when the input signal Sin has an on-level, and switches on the second switch 312 in order to switch off the first type transistor device 1 when the input signal Sin has an off-level. The control circuit 315 controls the first and second switch 311, 312 such that only one of these switches 311, 312 is switched on at one time. Optionally, a first current source 313 is connected in series with the first switch 311 and a second current source 312 is connected in series with the second switch 314. The first current source 313 defines a gate current, which is a current to the gate node 13, when the first type transistor device 1 switches on, and the second current source 314 defines the gate current, when the first type transistor device 1 switches off. For example, when the first type transistor device 1 is a normally-off transistor device, the first drive potential V1 is more than the threshold voltage of the first type transistor device 1 above the source potential (the electrical potential of the source node 12), and the second drive potential V2 may correspond to the source potential. That is, the second switch 312 may be connected between the gate node 13 and the source node 12 (as illustrated in dashed lines in FIG. 6). The first switch 311 and the second switch 312 can be implemented as conventional electronic switches, such as transistors.

Figure 7:
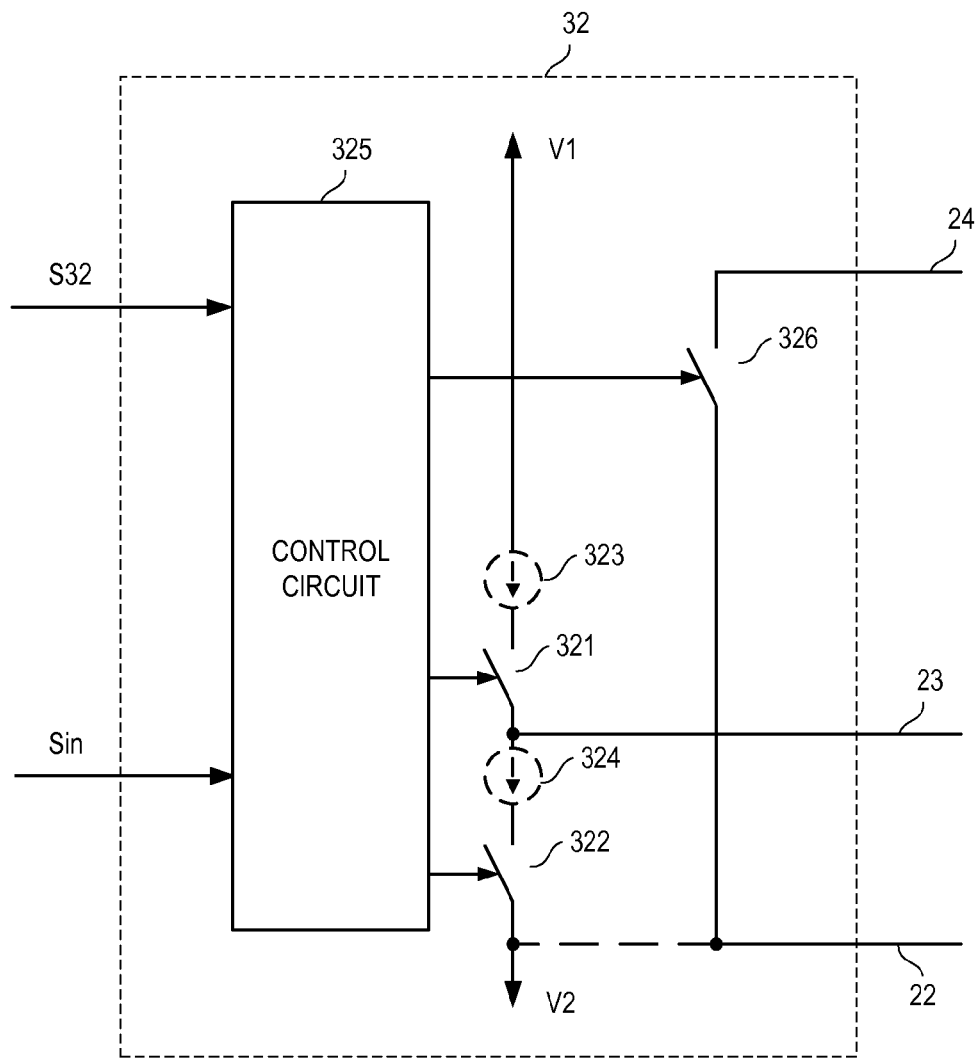
FIG. 7 illustrates one embodiment of a second drive unit in the drive circuit.

FIG. 7 shows one embodiment of the second drive unit 32. Equivalent to the first drive unit 31 explained with reference to FIG. 6, the second drive unit 32 includes a first switch 321 connected between the gate node 23 of the second type transistor device 2 (not shown in FIG. 7) and a circuit node where the first drive potential V1 is available, and a second switch 322 is connected between the gate node 23 and the circuit node where a second drive potential V2 is available. The first drive potential V1 is configured to switch on the second type transistor device 2 when applied to the gate node 23, and the second drive potential V2 is configured to switch off the second type transistor device 2 when applied to the gate node 23. When the second type transistor device 2 is implemented as a normally-off transistor device, the second drive potential V2 may correspond to the source potential (the electrical potential of the source node 22) of the second type transistor device 2.

The second drive unit 32 further includes a third switch 326 connected between the field plate node 24 and the source node 22. Alternatively, the third switch 326 is connected between the field plate node 24 and the gate node 23.

A control circuit 325 controls the first switch 321, the second switch 322 and the third switch 326 dependent on input signal Sin and the activation signal S32. For the purpose of explanation it is assumed that the activation signal S32 can assume either an activation level or a deactivation level. An activation level indicates that it is desired to activate the second type transistor device 2, and a deactivation level indicates that it is desired to deactivate the second type transistor device 2. The control circuit 325 is configured to close the third switch 326 and to switch on and off the second type transistor device 2 based on the input signal Sin when the activation signal S32 has an activation level. In this operation mode, the field plate of the second type transistor device 2 is connected to the source node 21 and the second type transistor device 2 switches on and off based on the input signal Sin, so that the second type transistor device 2 is activated and operates like the first type transistor device 1. The control circuit 325 switches on the second type transistor device 2 by switching on the first switch 321 and switches off the second type transistor device 2 by switching on the second switch 322 in this activated mode. The control circuit 325, like the control circuit 315 explained with reference to FIG. 6, is configured to switch on only one of the first switch 321 and the second switch 322 at one time.

When the activation signal S32 has a deactivation level, the control circuit 325 is configured to switch off the third switch 326 in order to decouple the field plate from the source node 22 (or the gate node 23 in the alternative embodiment). The field plate is floating in this operation mode (deactivated mode). Further, the control circuit 325 is configured to switch off the second type transistor device 2 by closing the second switch 322.

The operation of the drive circuit 32 explained hereinbefore is independent of whether the first type transistor device 1 and the second type transistor device 2 are normally-on or normally-off devices. Driving a normally-on transistor is different from driving a normally-off device only in terms of the drive potentials V1, V2.

Figure 8:
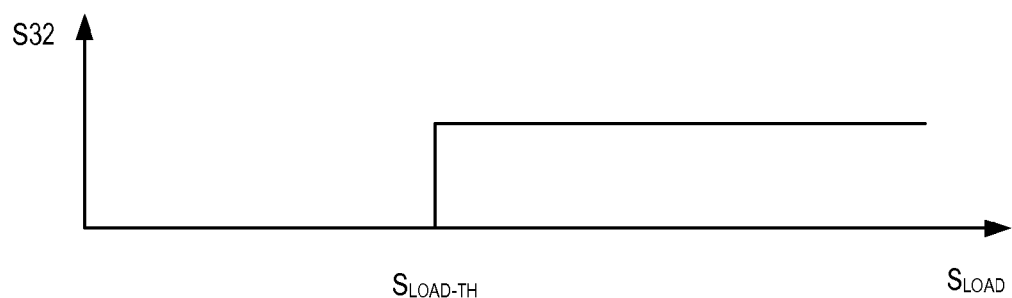
FIG. 8 illustrates the operation of the drive circuit based on a load signal.

FIG. 8 schematically illustrates one embodiment of the activation signal S32 dependent on the load signal $S_{LOAD}$. Just for the purpose of explanation it is assumed that a low signal level of the activation signal S32 represents a deactivation level, and a high signal level of the activation signal S32 represents and activation level. In the embodiment shown in FIG. 8, the activation signal S32 has a deactivation level when the load signal $S_{LOAD}$ is below a predefined threshold $S_{LOAD-TH}$ in order to deactivate the second type transistor device 2, and has an activation level when the load signal $S_{LOAD}$ is above the predefined threshold $S_{LOAD-TH}$ in order to activate the second type transistor device 2. Referring to FIG. 5, the activation circuit 5 receives the load signal $S_{LOAD}$. According to one embodiment, the activation circuit generates the activation signal S32 dependent on the load signal $S_{LOAD}$ as explained with reference to FIG. 8.

The load signal $S_{LOAD}$ may represent at least one load parameter of the circuit arrangement. Different embodiments of those load parameters and of how these load parameters may be measured are explained with reference to FIGS. 9-11 below.

Figure 9:
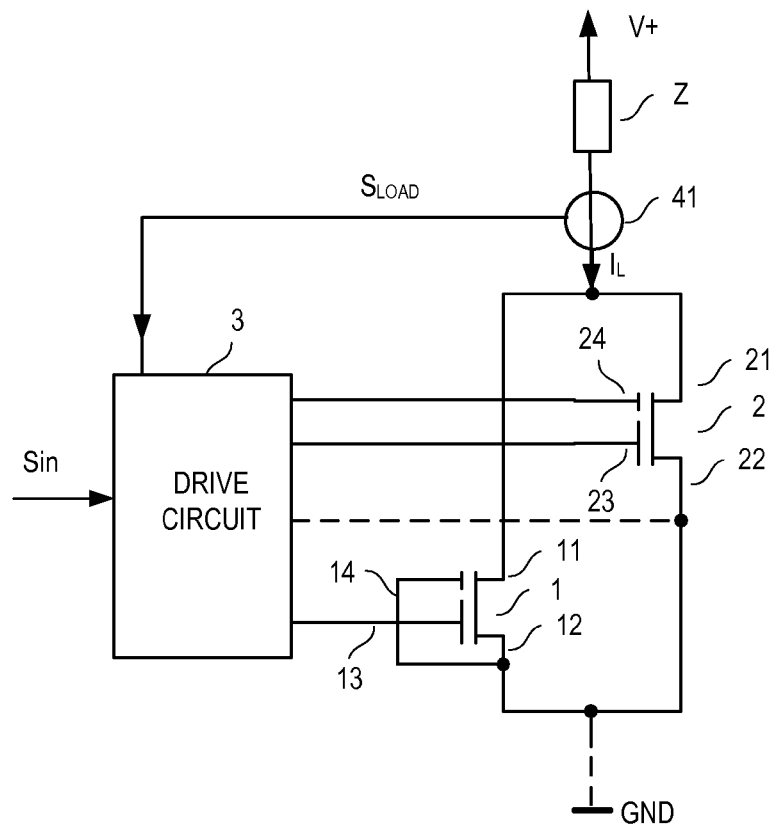
FIG. 9 illustrates one embodiment of an electronic circuit in which the load signal is generated based on a load current of the transistor arrangement.

Referring to FIG. 9, the load signal $S_{LOAD}$ may represent a load current $I_L$ through the transistor arrangement. In this case, the load signal $S_{LOAD}$ may be obtained using a current measurement circuit 41 that is coupled to the transistor arrangement and that is configured to measure the load current $I_L$ through the transistor arrangement. The current measurement circuit 41 may include a conventional current sensor that is configured to sense an electrical current and to generate a sense signal with a signal level which is based on a current level of the current. Examples of the current sensor, without being restricted to, include a shunt resistor, a Hall effect sensor, or an inductive current sensor.

According to one embodiment, the drive circuit 3 is configured to activate the second type transistor device 2 when the load signal $S_{LOAD}$ indicates that the load current $I_L$ is above a predefined current threshold. That is, the activation circuit 5 is configured to generate an activation level of the activation signal S32 when the load current $I_L$ is above a predefined current threshold, and to generate a deactivation level of the activation signal S32 when the load current $I_L$ is on or below the predefined current threshold. In this embodiment, at low load currents, which are load currents below the current threshold, only the first transistor device 1 is activated, while at high load currents, which are load currents above the predefined threshold, both the first transistor device 1 and the second transistor device 2 are activated.

Figure 10:
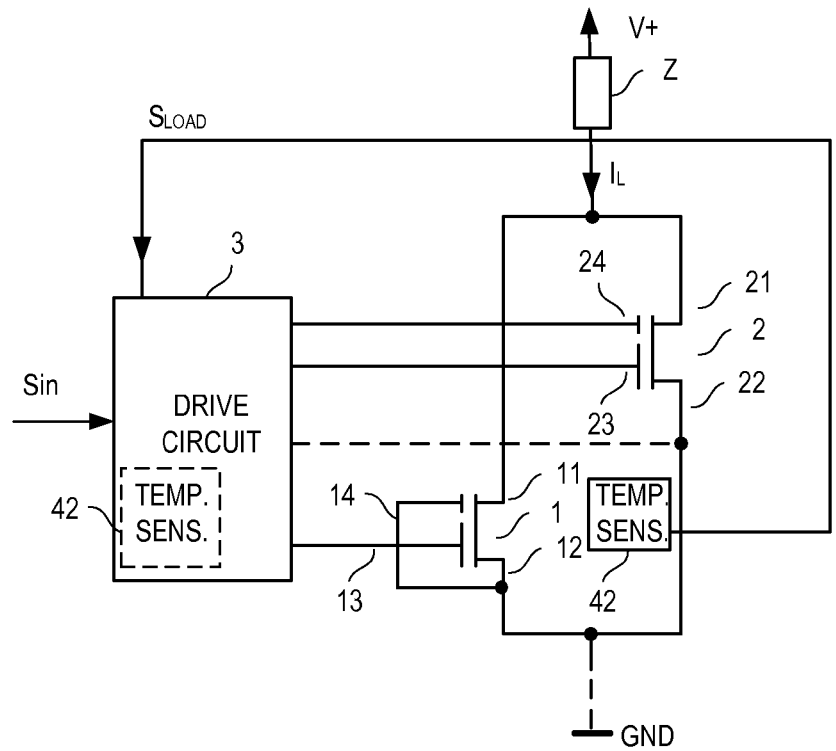
FIG. 10 illustrates one embodiment of an electronic circuit in which the load signal is generated based on a temperature of the transistor arrangement.

According to another embodiment illustrated in FIG. 10, the load signal $S_{LOAD}$ is dependent on a temperature of the transistor arrangement. In this embodiment, a temperature sensor 42 provides the load signal $S_{LOAD}$ to the temperature of the transistor arrangement. The temperature sensor 42 may be arranged outside the drive circuit (as shown). According to another embodiment (illustrated in dashed lines), the temperature is integrated in the drive circuit 3. The drive circuit 3 can be implemented as an integrated circuit.

In this embodiment, the drive circuit 3 is configured to deactivate the second type transistor device 2 when the load signal $S_{LOAD}$ indicates that the temperature of the transistor arrangement is below a predefined temperature threshold, and activates the second type transistor device 2 when the load signal $S_{LOAD}$ indicates that the temperature is above the temperature threshold.

Figure 11:
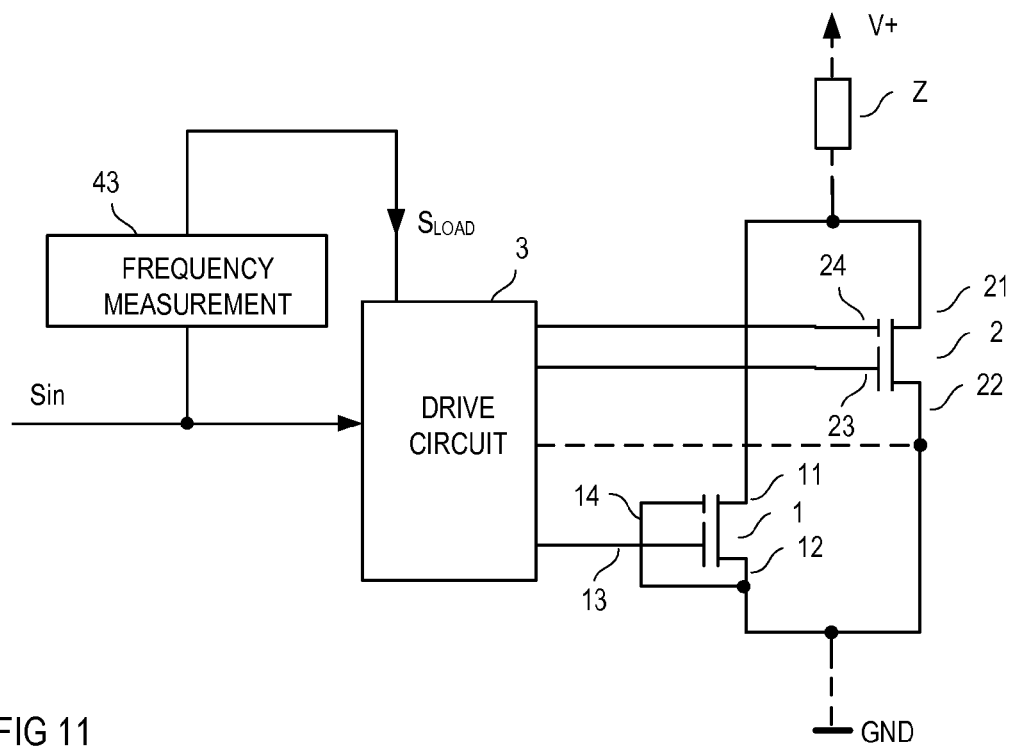
FIG. 11 illustrates one embodiment of an electronic circuit in which the load signal is generated based on a frequency of an input signal of the transistor arrangement.

According to another embodiment shown in FIG. 11, the load signal $S_{LOAD}$ is dependent on a frequency of the input signal Sin. The frequency of the input signal Sin is the rate at which the input signal Sin changes the signal level from the off-level to the on-level. A frequency measurement circuit 43 receives the input signal Sin and is configured to generate the load signal $S_{LOAD}$ dependent on the measured frequency. According to one embodiment, the drive circuit 3 is configured to deactivate the second type transistor device 2 when the load signal $S_{LOAD}$ indicates that the frequency of the input signal Sin is above a predefined frequency threshold, and is configured to activate the second type transistor device 2 when the load signal $S_{LOAD}$ indicates that the frequency of the input signal Sin is below the predefined frequency threshold. This takes into account that switching losses increase as a switching frequency of the input signal Sin, which defines the switching frequency of the first and second type transistor devices 1, 2 of the transistor arrangement, increases. Deactivating the second type transistor device 2 in this operation mode helps to reduce switching losses.

According to another embodiment, the load signal $S_{LOAD}$ is dependent on two or more of the load current $I_L$, the temperature of the transistor arrangement and the frequency of the input signal Sin. In this embodiment, a weighted sum of two or more of these parameters is calculated in order to obtain the load signal $S_{LOAD}$, wherein positive weight factors may be used to consider the load current $I_L$ and the temperature, and a negative weight factor may be used to consider the switching frequency. Like in the embodiments explained herein before, the second type transistor device 2 is deactivated when the load signal $S_{LOAD}$ is below a predefined threshold, and is activated when the load signal $S_{LOAD}$ is above the predefined threshold.

Figure 12:
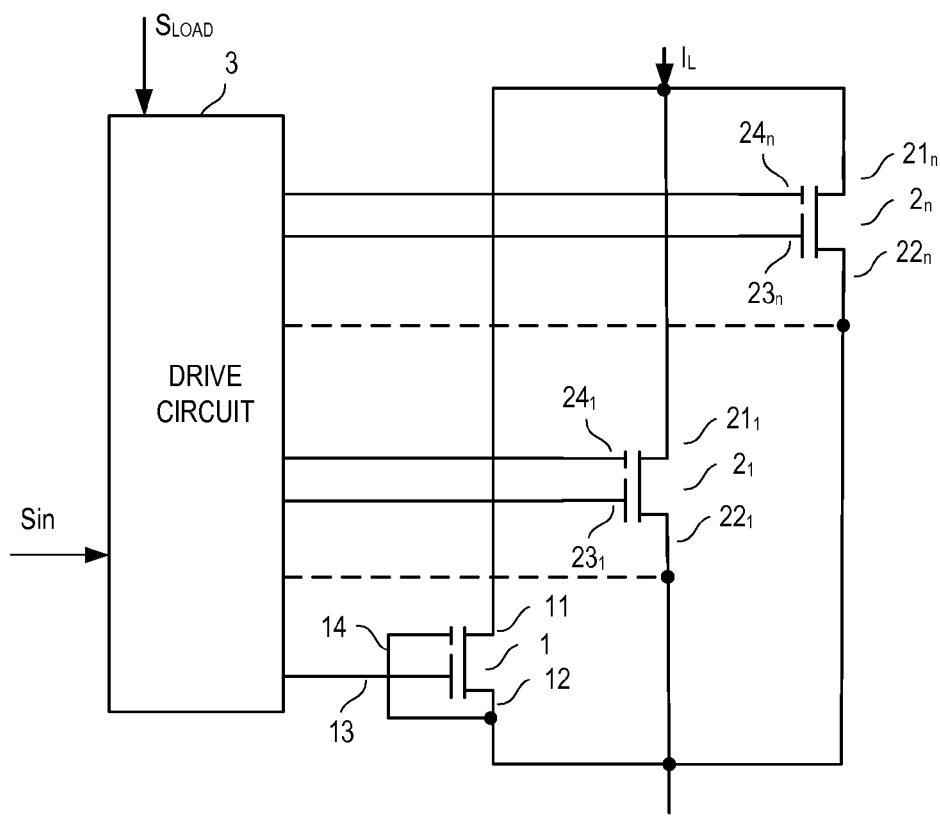
FIG. 12 shows one embodiment of an electronic circuit that includes a transistor arrangement with a first type transistor device and several second type transistor devices, and a drive circuit.

In the embodiments explained herein before, the transistor arrangement includes one first type transistor device 1 and one second type transistor device 2. However, this is only an example. The transistor arrangement may as well be implemented with two or more second type transistor devices. FIG. 12 shows one embodiment of a transistor arrangement that includes one first type transistor device 1 and two second type transistor devices $2_1$, $2_n$. The first type transistor device 1 and the second type transistor devices $2_1$-$2_n$ have their load paths connected in parallel. In case of the first type transistor device 1, the load path is between drain node 11 and source node 12. In case of the second type transistor devices, the load paths are between drain nodes $11_1$-$11_n$ and source nodes $12_1$-$12_n$.

The field plate node 14 of the first type transistor device 1 is either coupled to the source node 12 (as illustrated) or to the gate node 13 (not illustrated). The field plate nodes $24_1$, $24_n$ and the gate nodes $23_1$, $23_n$ of the second type transistor devices $2_1$-$2_n$ are controlled by the drive circuit 3. In this embodiment, the drive circuit 3 is configured to select the number of second type transistor devices $2_1$-$2_n$ that are activated based on the load signal $S_{LOAD}$. For example, in case the transistor arrangement includes two second type transistor devices $2_1$-$2_n$, the drive circuit 3 is configured to deactivate both second type transistor devices when the load signal $S_{LOAD}$ is below a first predefined threshold, is configured to activate only one of the second type transistor devices $2_1$, $2_n$ when the load signal $S_{LOAD}$ is between the first threshold and a second threshold higher than the first threshold, and is configured to activate both of the second type transistor devices $2_1$, $2_n$ when the load signal $S_{LOAD}$ is above the second threshold. Equivalently, more than two thresholds may be defined when the transistor arrangement includes more than two second type transistor devices $2_1$, $2_n$.

In case the second type transistor devices $2_1$, $2_n$ have different current ratings, the drive circuit 3 may be configured not only to select the number of second type transistor devices that are activated dependent on the load signal $S_{LOAD}$ but may also be configured to select which one of the second type transistor devices is to be activated dependent on the load signal $S_{LOAD}$.

Figure 13:
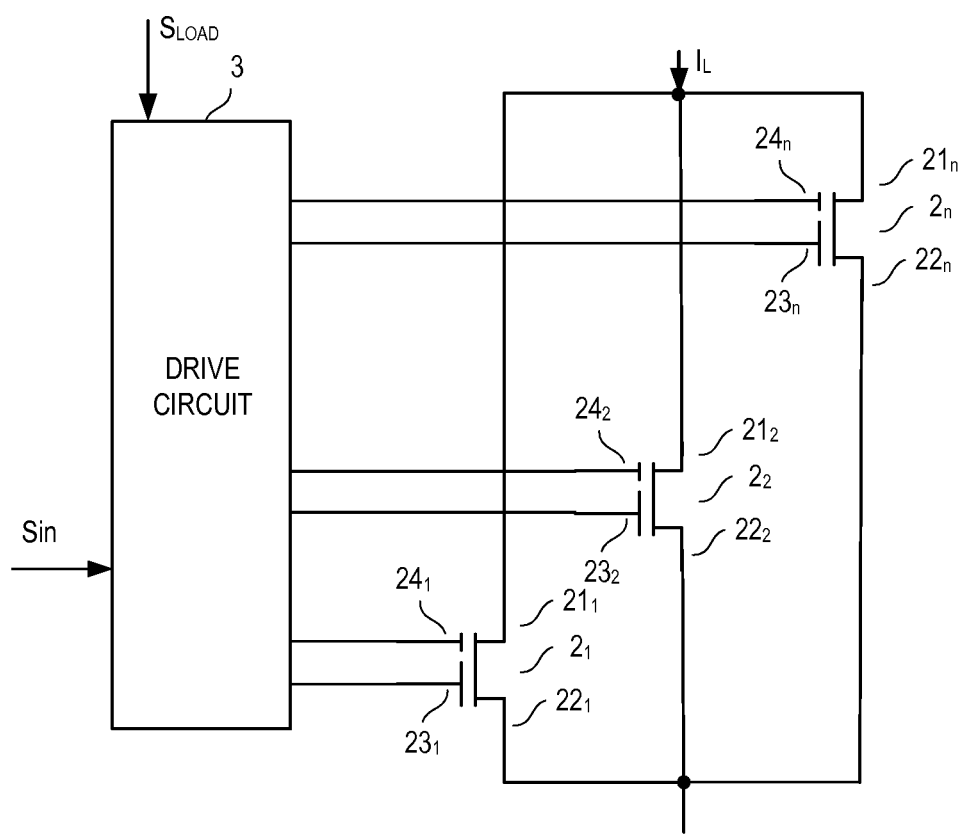
FIG. 13 shows one embodiment of an electronic circuit that includes a transistor arrangement with several second type transistor devices, and a drive circuit.

FIG. 13 illustrates another embodiment of an electronic circuit. In this embodiment, the transistor arrangement includes second type transistor devices $2_1$-$2_n$ only. These second type transistor devices $2_1$-$2_n$ have their load paths connected in parallel. The field plate nodes $24_1$-$24_n$ and the gate nodes $23_1$-$23_n$ of these second type transistor devices 2 are driven by the drive circuit 3. In this embodiment, the drive circuit 3 selects the number of second type transistor devices that are to be activated based on the load signal $S_{LOAD}$, wherein there is always activated at least one of the second type transistor devices $2_1$-$2_n$. The second type transistor devices $2_1$-$2_n$ can be activated and deactivated as explained with reference to FIG. 7 herein before.

In the following, the group of second type transistor device(s) that are/is activated in one drive cycle will be referred to as activated group. The number of second transistor devices in this activated group is dependent on the load signal $S_{LOAD}$. While the number of second transistor devices in the activated group may stay the same as long as the load signal $S_{LOAD}$ indicates a certain load condition, the members (the second transistor devices) of the group may change every switching cycle or every several switching cycles. A switching cycle includes a time period in which a respective transistor device is switched on, and a time period in which the respective switching device is switched off. Changing the composition of the activated group may help to more equally distribute power losses to the individual transistor devices.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising:
a transistor arrangement with a first type transistor device and at least one second type transistor device, each comprising a control node and a load path between a first load node and a second load node, and having the load paths connected in parallel; and
a drive circuit coupled to the control node of the first type transistor device and the control node of the second type transistor device, and configured to receive an input signal,
wherein each of the first type transistor device and the second type transistor device comprises a two-dimensional electron gas (2DEG) in the load path, and a field plate adjacent the 2DEG, wherein the field plate of the first type transistor device is connected to one of the control node and the second load node of the first type transistor device,
wherein the drive circuit is configured to receive a load signal that represents at least one load parameter of the transistor arrangement and is configured to one of activate and deactivate the at least one second type transistor device based on the load signal,
wherein the first type transistor device and the at least one second type transistor device are integrated in a common semiconductor body,
wherein the 2DEG of the first type transistor device is insulated from the 2DEG of the at least one second type transistor device by an insulation region,
wherein the insulation region includes a damaged crystal region.

2. An electronic circuit, comprising:
a transistor arrangement with a first type transistor device and at least one second type transistor device, each comprising a control node and a load path between a first load node and a second load node, and having the load paths connected in parallel; and
a drive circuit coupled to the control node of the first type transistor device and the control node of the second type transistor device, and configured to receive an input signal,
wherein each of the first type transistor device and the second type transistor device comprises a two-dimensional electron gas (2DEG) in the load path, and a field plate adjacent the 2DEG, wherein the field plate of the first type transistor device is connected to one of the control node and the second load node of the first type transistor device,
wherein the drive circuit is configured to receive a load signal that represents at least one load parameter of the transistor arrangement and is configured to one of activate and deactivate the at least one second type transistor device based on the load signal,
wherein the first type transistor device and the at least one second type transistor device are integrated in a common semiconductor body,
wherein the 2DEG of the first type transistor device is insulated from the 2DEG of the at least one second type transistor device by an insulation region,
wherein the insulation region includes a trench extending through the 2DEG.

3. An electronic circuit, comprising:
a transistor arrangement with a first type transistor device and at least one second type transistor device, each comprising a control node and a load path between a first load node and a second load node, and having the load paths connected in parallel, and
a drive circuit coupled to the control node of the first type transistor device and the control node of the second type transistor device, and configured to receive an input signal,
wherein each of the first type transistor device and the second type transistor device comprises a two-dimensional electron gas (2DEG) in the load path, and a field plate adjacent the 2DEG, wherein the field plate of the first type transistor device is connected to one of the control node and the second load node of the first type transistor device,
wherein the drive circuit is configured to receive a load signal that represents at least one load parameter of the transistor arrangement and is configured to one of activate and deactivate the at least one second type transistor device based on the load signal,
wherein the drive circuit is configured to deactivate the at least one second type transistor device by driving the field plate of the at least one second type transistor device to be floating, and by driving the control node of the at least one second type transistor device such that the at least one second type transistor device is in an off-state.

4. The electronic circuit of claim 3, wherein the drive circuit is configured to activate the at least one second type transistor device by connecting the field plate of the at least one second type transistor device to one of the second load node and the control node of the at least one second type transistor device, and by driving the control node of the at least one second type transistor device dependent on the input signal.

5. The electronic circuit of claim 3, wherein the drive circuit is configured to drive the control node of the first type transistor device dependent on the input signal.

6. The electronic circuit of claim 3, wherein the at least one load parameter is selected from the group consisting of:
a current level of a load current through the transistor arrangement;
a temperature of the transistor arrangement; and
a switching frequency of the input signal.

7. The electronic circuit of claim 6, wherein the drive circuit is configured to activate the at least one second type transistor device when a current level of the load current is above a predefined current threshold, and deactivate the at least one second type transistor device when the current level of the load current is at or below the predefined current threshold.

8. The electronic circuit of claim 6, wherein the drive circuit is configured to activate the at least one second type transistor device when a temperature level of the temperature is above a predefined temperature threshold, and deactivate the at least one second type transistor device when the temperature level of the temperature is below the predefined temperature threshold.

9. The electronic circuit of claim 6, wherein the drive circuit is configured to activate the at least one second type transistor device when the switching frequency is below a predefined frequency threshold, and deactivate the at least one second type transistor device when the switching frequency is above the predefined frequency threshold.

10. The electronic circuit of claim 6, wherein the load signal represents two or more different load parameters.

11. A method, comprising:
obtaining a load signal that represents at least one load parameter of a transistor arrangement that comprises a first type transistor device and at least one second type transistor device;
receiving an input signal by a drive circuit; and
one of activating and deactivating by the drive circuit the at least one second type transistor device based on the load signal,
wherein each of the first type transistor device and the at least one second type transistor device comprises a control node, a load path between a first load node and a second load node, a two-dimensional electron gas (2DEG) in the load path, and a field plate adjacent the 2DEG,
wherein the load paths of the first type transistor device and the at least one second type transistor device are connected in parallel,
wherein the field plate of the first type transistor device is connected to one of the control node and the second load node of the first type transistor device,
wherein the first type transistor device and the at least one second type transistor device are integrated in a common semiconductor body,
wherein the 2DEG of the first type transistor device is insulated from the 2DEG of the at least one second type transistor device by an insulation region,
wherein the insulation region includes a damaged crystal region.

12. A method, comprising:
obtaining a load signal that represents at least one load parameter of a transistor arrangement that comprises a first type transistor device and at least one second type transistor device;
receiving an input signal by a drive circuit; and
one of activating and deactivating by the drive circuit the at least one second type transistor device based on the load signal,
wherein each of the first type transistor device and the at least one second type transistor device comprises a control node, a load path between a first load node and a second load node, a two-dimensional electron gas (2DEG) in the load path, and a field plate adjacent the 2DEG,
wherein the load paths of the first type transistor device and the at least one second type transistor device are connected in parallel,
wherein the field plate of the first type transistor device is connected to one of the control node and the second load node of the first type transistor device,
wherein the first type transistor device and the at least one second type transistor device are integrated in a common semiconductor body,
wherein the 2DEG of the first type transistor device is insulated from the 2DEG of the at least one second type transistor device by an insulation region,
wherein the insulation region includes a trench extending through the 2DEG.

13. A method, comprising:
obtaining a load signal that represents at least one load parameter of a transistor arrangement that comprises a first type transistor device and at least one second type transistor device;
receiving an input signal by a drive circuit; and
one of activating and deactivating by the drive circuit the at least one second type transistor device based on the load signal,
wherein each of the first type transistor device and the at least one second type transistor device comprises a control node, a load path between a first load node and a second load node, a two-dimensional electron gas (2DEG) in the load path, and a field plate adjacent the 2DEG,
wherein the load paths of the first type transistor device and the at least one second type transistor device are connected in parallel,
wherein the field plate of the first type transistor device is connected to one of the control node and the second load node of the first type transistor device,
wherein deactivating the at least one second type transistor device comprises:
driving the field plate of the at least one second type transistor device to be floating; and
driving the control node of the at least one second type transistor device such that the at least one second type transistor device is in an off-state.

14. The method of claim 13, wherein activating the at least one second type transistor device comprises:
connecting the field plate of the at least one second type transistor device to one of the second load node and the control node of the at least one second type transistor device; and
driving the control node of the at least one second type transistor device dependent on the input signal.

15. The method of claim 13, further comprising:
driving by the drive circuit the control node of the first type transistor device dependent on the input signal.

16. The method of claim 13, wherein the at least one load parameter is selected from the group consisting of:
a current level of a load current through the transistor arrangement;
a temperature of the transistor arrangement; and
a switching frequency of the input signal.

17. The method of claim 16, further comprising:
activating the at least one second type transistor device when a current level of the load current is above a predefined current threshold; and
deactivating the at least one second type transistor device when the current level of the load current is on or below the predefined current threshold.

18. The method of claim 16, further comprising:
activating the at least one second type transistor device when a temperature level of the temperature is above a predefined temperature threshold; and
deactivating the at least one second type transistor device when the temperature level of the temperature is below the predefined temperature threshold.

19. The method of claim 16, further comprising:
activating the at least one second type transistor device when the switching frequency is below a predefined frequency threshold; and
deactivating the at least one second type transistor device when the switching frequency is above the predefined frequency threshold.

20. The method of claim 13, wherein the load signal represents two or more different load parameters.

21. The method of claim 13, wherein the first type transistor device and the at least one second type transistor device have substantially identical geometrical device characteristics.

22. The method of claim 13, wherein the first type transistor device and the least one second type transistor are different in at least one device characteristic selected from the group consisting of:
drain-source distance;
source-gate distance;
gate-drain distance; and
barrier layer overlap.

23. The method of claim 22, wherein the at least one second type transistor device comprises a larger gate-drain distance than the first type transistor device.

24. The method of claim 22, wherein the first type transistor device and the at least one second type transistor device comprises different barrier layer overlaps.

* * * * *